United States Patent
Autryve et al.

(10) Patent No.: US 7,109,087 B2
(45) Date of Patent: Sep. 19, 2006

(54) ABSORBER LAYER FOR DSA PROCESSING

(75) Inventors: Luc Van Autryve, Mennecy (FR); Chris D. Bencher, San Jose, CA (US); Dean Jennings, Beverly, MA (US); Haifan Liang, Oakland, CA (US); Abhilash J. Mayur, Salinas, CA (US); Mark Yam, Monte Sereno, CA (US); Wendy H. Yeh, Mountain View, CA (US); Richard A. Brough, Wingdale, NY (US)

(73) Assignee: Applied Materials, Inc., Santa Clara, CA (US)

( * ) Notice: Subject to any disclaimer, the term of this patent is extended or adjusted under 35 U.S.C. 154(b) by 7 days.

(21) Appl. No.: 10/679,189

(22) Filed: Oct. 3, 2003

(65) Prior Publication Data

US 2005/0074956 A1   Apr. 7, 2005

(51) Int. Cl.
  *H01L 21/336*   (2006.01)
  *H01L 21/425*   (2006.01)
  *H01L 21/26*    (2006.01)

(52) U.S. Cl. .................. 438/308; 483/514; 483/535; 483/542

(58) Field of Classification Search .............. 438/301, 438/308, 514, 542, 535
See application file for complete search history.

(56) References Cited

U.S. PATENT DOCUMENTS

| 5,000,113 | A |   | 3/1991  | Wang et al. ............ 118/723 E |
| 5,559,367 | A |   | 9/1996  | Cohen et al. ................ 257/77 |
| 5,569,501 | A | * | 10/1996 | Bailey et al. ............... 427/577 |
| 5,599,590 | A | * | 2/1997  | Hayashi et al. ............. 427/448 |
| 5,744,375 | A |   | 4/1998  | Kao et al. ................... 438/508 |
| 6,303,476 | B1 |   | 10/2001 | Hawryluk et al. .......... 438/530 |
| 6,475,888 | B1 | * | 11/2002 | Sohn ........................ 438/535 |
| 6,479,821 | B1 |   | 11/2002 | Hawryluk et al. ....... 250/316.1 |
| 6,495,390 | B1 |   | 12/2002 | Hawryluk et al. ........... 438/56 |
| 6,559,017 | B1 | * | 5/2003  | Brown et al. ............... 438/302 |
| 6,573,030 | B1 |   | 6/2003  | Fairbairn et al. |
| 6,650,480 | B1 |   | 11/2003 | Tanaka ..................... 359/618 |
| 2002/0139975 | A1 |   | 10/2002 | Lewis et al. ................. 257/40 |
| 2003/0148594 | A1 |   | 8/2003  | Yamazaki et al. ......... 438/487 |

(Continued)

FOREIGN PATENT DOCUMENTS

KR    375093 B  *  3/2003

OTHER PUBLICATIONS

Article by Valentini et al., "Effect fo thermal annealing on the electronic properties of nitrogen doped amorphous carbon/$p$-type crystalline silicon heterojunction diodes", American Vacuum Society, 2003, pp. 582-588.

(Continued)

*Primary Examiner*—Hsien-Ming Lee
(74) *Attorney, Agent, or Firm*—Patterson & Sheridan, LLP

(57) ABSTRACT

A method of processing a substrate comprising depositing a layer comprising amorphous carbon on the substrate and then laser annealing the substrate is provided. Optionally, the layer further comprises a dopant selected from the group consisting of nitrogen, boron, phosphorus, fluorine, and combinations thereof. In one aspect, the layer comprising amorphous carbon is an anti-reflective coating and an absorber layer that absorbs electromagnetic radiation emitted by the laser and anneals a top surface layer of the substrate.

23 Claims, 4 Drawing Sheets

U.S. PATENT DOCUMENTS

2003/0196995 A1    10/2003  Jennings .............. 219/121.73
2003/0201466 A1    10/2003  Ogawa et al. ............. 257/200
2004/0115935 A1     6/2004  Liu
2005/0056940 A1*    3/2005  Sandhu et al. ............ 257/770

OTHER PUBLICATIONS

Article by Barradas et al., "Growth and characterization of amorphous carbon films doped with nitrogen", Nuclear Instruments and Methods in Physics Research B, 161-163 (2000) pp. 969-974.

Article by Kuo et al., "Field emission studies of low-temperature thermal annealing of nitrogen-doped hydrogenated amorphous carbon (a-C:H:N) films", Diamond and Related Materials 10 (2001) pp. 889-894.

Article by Zhang et al., "Raman analysis of laser annealed nitrogen doped amorphous carbon film", Solid State Communications 123 (2002) pp. 97-100.

PCT International Search Report from International Application No. PCT/US 2004/032151, dated Feb. 14, 2005.

* cited by examiner

ABSORBER LAYER FOR DSA PROCESSING

BACKGROUND OF THE INVENTION

1. Field of the Invention

Embodiments of the present invention generally relate to the fabrication of integrated circuits. More specifically, embodiments of the present invention generally relate to processes for depositing a layer on a substrate and then annealing the substrate.

2. Description of the Related Art

Many processes in integrated circuit fabrication require rapid high temperature processing steps for deposition of layers on semiconductor substrates, such as silicon-containing substrates, or annealing of previously deposited layers on semiconductor substrates. For example, after dopant ions, such as boron, phosphorus, or arsenic, are implanted into a semiconductor substrate, the substrate is typically annealed to repair the crystalline structure of the substrate that was disrupted during the doping process and to activate the dopants.

It is typically preferred to heat and cool substrates quickly to minimize the amount of time that a substrate is exposed to high temperatures that can cause unwanted diffusion and damage the substrate. Rapid Thermal Processing (RTP) chambers and methods that can raise substrate temperatures at rates on the order of about 200 to 400° C./second have been developed. RTP processes provide an improved rapid heating method compared to the heating provided by batch furnaces, which typically raise substrate temperatures at a rate of about 5–15° C./minute.

While RTP processes can heat and cool a substrate quickly, RTP processes often heat the entire thickness of a substrate. Heating the entire thickness of a semiconductor substrate is often unnecessary and undesirable, as the devices requiring annealing on a semiconductor substrate typically only extend through a top surface layer, such as a few microns of the substrate. Furthermore, heating the entire thickness of the substrate increases the amount of time required for the substrate to cool down, which can increase the time required to process a substrate and thus reduce substrate throughput in a semiconductor processing system. Increasing the amount of time required for the substrate to cool down also limits the amount of time the substrate can be exposed to the elevated temperature required for activation.

Uneven heating across the surface of a substrate is another problem that is often experienced with RTP or other conventional substrate heating processes. As today's integrated circuits generally include a plurality of devices spaced at varying densities across a surface of a substrate and having different sizes, shapes, and materials, a substrate surface can have very different thermal absorption properties across different areas of the substrate surface. For example, a first region of a substrate having a lower density of devices thereon typically will be heated faster than a second region of the substrate that has a higher density of devices thereon than the first region. Varying reflectivities across different areas of the substrate surface can also make uniform heating of the substrate surface challenging.

Therefore, there remains a need for a method of uniformly heating a semiconductor substrate across a surface of the substrate during an annealing process.

SUMMARY OF THE INVENTION

Embodiments of the invention provide a method of processing a substrate comprising depositing a layer on the substrate, and then laser annealing the substrate. In one aspect, the layer comprises amorphous carbon. In another aspect, the layer further comprises nitrogen, boron, phosphorus, fluorine, or combinations thereof. In one embodiment, the layer is laser annealed after implanting dopant ions into the substrate.

In another aspect, a method of processing a substrate is provided, the method comprising depositing a layer having a thickness of between about 200 Å and about 2.5 µm under conditions sufficient to provide the layer with an emissivity of about 0.84 or greater for electromagnetic radiation having a wavelength of between about 600 nm and about 1000 nm, and then laser annealing the substrate.

A substrate, processed by a method comprising depositing a layer comprising amorphous carbon on the substrate, and then laser annealing the substrate is also provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide a method of processing a substrate, comprising depositing a layer on the substrate to promote uniform heating across a surface of the substrate during laser annealing of the substrate. In one embodiment, the layer is deposited to a thickness of between about 200 Å and about 2.5 µm under conditions sufficient to provide the layer with an emissivity of about 0.84 or greater for electromagnetic radiation having a wavelength of between about 600 nm and about 1000 nm, and then laser annealing the substrate.

In one embodiment, the layer comprises amorphous carbon and hydrogen. In one aspect, the layer is an amorphous carbon layer comprising carbon atoms and hydrogen atoms. In another embodiment, the layer comprises amorphous carbon, hydrogen, and a dopant selected from a group consisting of nitrogen, boron, phosphorus, fluorine, or combinations thereof. In one aspect, the layer is a doped amorphous carbon layer comprising carbon atoms, hydrogen atoms, and dopant atoms selected from the group consisting of nitrogen, boron, phosphorus, fluorine, and combinations thereof. In all embodiments, preferably, the layer includes no metal or substantially no metal. The layer may be deposited by plasma enhanced chemical vapor deposition (PECVD) of a gas mixture comprising a carbon source. Preferably, the carbon source is a gaseous hydrocarbon. For example, the carbon source may be propylene ($C_3H_6$). The gas mixture may be formed from a carbon source that is a liquid precursor or a gaseous precursor. In one embodiment, a liquid precursor is used to improve sidewall and corner coverage of devices or features that may be on the substrate. The gas mixture may further comprise a carrier gas, such as helium (He). The layer may be deposited to a thickness of between about 100 Å and about 20,000 Å. Preferably, the layer is deposited to a thickness between about 800 Å and about 1500 Å, such as a thickness of about 1200 Å. The layer may be deposited in any chamber capable of performing PECVD. In one embodiment, the layer is deposited under high density plasma conditions to enhance the gap filling capability of the layer between devices or features on the substrate. An example of a chamber that may be used is the a DSM APF chamber, available from Applied Materials, Inc., of Santa Clara, Calif.

Figure 1:
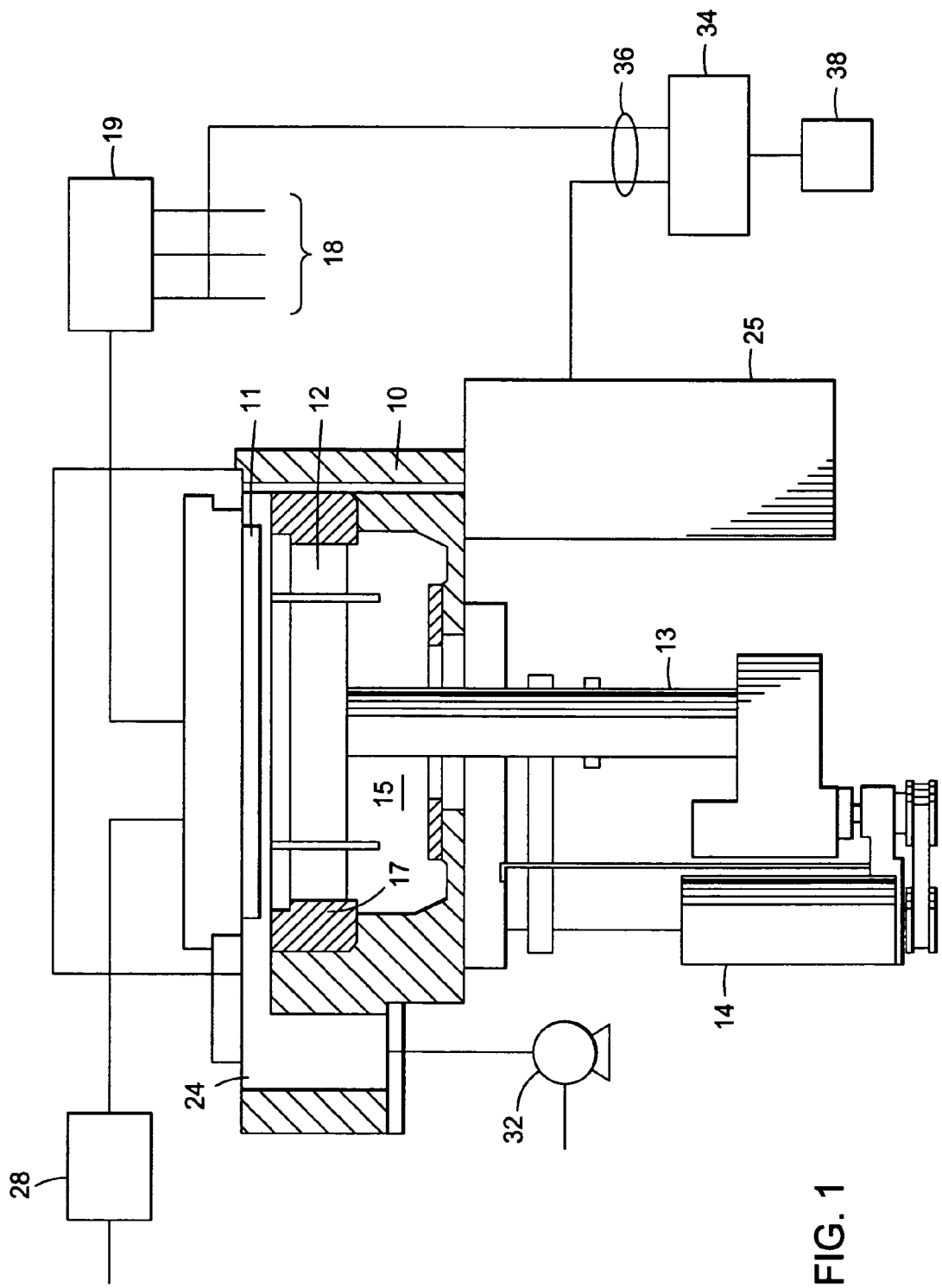
FIG. 1 is a cross-sectional diagram of an exemplary chemical vapor deposition reactor configured for use according to embodiments described herein.

FIG. 1 shows an example of a vertical, cross-section view of a parallel plate CVD processing chamber 10. The chamber 10 includes a high vacuum region 15 and a gas distribution manifold 11 having perforated holes for dispersing process gases therethrough to a substrate (not shown). The substrate rests on a substrate support plate or susceptor 12. The susceptor 12 is mounted on a support stem 13 that connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. An insulator 17 surrounds the susceptor 12 and the substrate when in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (not shown) to measure the flow of gas through the gas supply lines 18. When toxic gases are used in the process, several safety shut-off valves are positioned on each gas supply line 18 in conventional configurations.

A controlled plasma is typically formed adjacent the substrate by RF energy applied to the gas distribution manifold 11 using a RF power supply 25. Alternatively, RF power can be provided to the susceptor 12. The RF power to the deposition chamber may be cycled or pulsed. The power density of the plasma is between about 0.0016 W/cm$^2$ and about 155 W/cm$^2$, which corresponds to a RF power level of about 1.1 W to about 100 kW for a 300 mm substrate.

The RF power supply 25 can supply a single frequency RF power between about 0.01 MHz and 300 MHz, such as about 13.56 MHz. Alternatively, the RF power may be delivered using mixed, simultaneous frequencies to enhance the decomposition of reactive species introduced into the high vacuum region 15. In one aspect, the mixed frequency is a lower frequency of about 12 kHz and a higher frequency of about 13.56 mHz. In another aspect, the lower frequency may range between about 300 Hz to about 1,000 kHz, and the higher frequency may range between about 5 mHz and about 50 mHz.

Typically, any or all of the chamber lining, distribution manifold 11, susceptor 12, and various other reactor hardware is made out of materials such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," which is incorporated by reference herein.

A system controller 34 controls the motor 14, the gas mixing system 19, and the RF power supply 25 which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard which defines board, card cage, and connector dimensions and types. The VME standard also defines the bus structure having a 16-bit data bus and 24-bit address bus.

The carbon source may be introduced into the mixing system 19 at a rate of between about 30 sccm and about 3000 sccm, and the carrier gas may be introduced into the chamber at a rate of between about 100 sccm and about 5000 sccm. During deposition, the substrate is maintained at a temperature between about 200° C. and about 1500° C., such as a temperature between about 300° C. and about 700° C. For example, the substrate may be maintained at a temperature of about 550° C. The deposition pressure is typically between about 5 Torr and about 50 Torr, such as about 7 Torr. RF power of between about 500 W and about 1500 W may be applied in the chamber at a frequency of about 13.56 MHz.

In another embodiment, the layer comprises amorphous carbon and nitrogen. The layer may be deposited by PECVD of a gas mixture comprising the carbon source and a dopant source selected from the group consisting of a nitrogen source, a boron source, a phosphorus source, a fluorine source, and combinations thereof. Preferably, the nitrogen source is nitrogen ($N_2$). The gas mixture may further comprise a carrier gas, such as helium (He). The carbon source may be introduced into the mixing system 19 at a rate of between about 30 sccm and about 3000 sccm, the dopant source may be introduced into the mixing system 19 at a rate of between about 30 sccm and about 5000 sccm, and the carrier gas may be introduced into the mixing system 19 at a rate of between about 160 sccm and about 5000 sccm. The layer may be deposited to a thickness of between about 800 Å and about 1500 Å, such as a thickness of about 1150 Å. During deposition, the substrate is maintained at a temperature between about 200° C. and about 1500° C. Preferably, the substrate is maintained at a temperature between about 400° C. and about 500° C. For example, the substrate may be maintained at a temperature of about 400° C. The deposition pressure is typically between about 5 Torr and about 50 Torr, such as about 7 Torr.

After the layer is deposited on the substrate, the substrate is laser annealed. Preferably, the substrate is laser annealed with continuous wave electromagnetic radiation emitted from a laser. As defined herein, "continuous wave electromagnetic radiation" is radiation that is emitted continuously, i.e., not in a burst or pulse. Alternatively, the substrate may be laser annealed with pulses of electromagnetic radiation.

In one embodiment, the electromagnetic radiation has a wavelength between about 600 nm and about 1000 nm. In a preferred embodiment, the electromagnetic radiation has a wavelength between about 808 nm and about 810 nm. Preferably, the extinction coefficient of the layer at a wavelength of about 808 nm to about 810 nm is about 0.01 to about 2.0. Typically, the power density of the electromagnetic radiation emitted by the laser is between about 10 kW/cm$^2$ and about 200 kW/cm$^2$, such as about 60 kW/cm$^2$.

During the laser annealing, the substrate is scanned with a line of radiation emitted by the laser. The line of electromagnetic radiation may be between about 3 µm and about 500 µm wide, such as about 35 µm wide. The electromagnetic radiation emitted by the laser is substantially absorbed by the layer. The layer reflects little if any of the electromagnetic radiation emitted by the laser. Thus, the layer may be described as both an absorber layer and an anti-reflective coating layer. The layer then transfers the thermal energy created by the absorbed electromagnetic radiation to the substrate on which the layer is deposited, and the substrate is heated and annealed. Preferably, only a top surface layer of the substrate, such as the top 15 µm of the substrate surface that faces the laser is heated and annealed. Thus, in one embodiment, the annealing process is a dynamic surface annealing (DSA) process. In one embodiment, a top surface layer of the substrate is heated to a temperature between about 1100° C. and about 1410° C. and cooled down to near ambient temperature in a time on the order of 1 millisecond.

Figure 2:
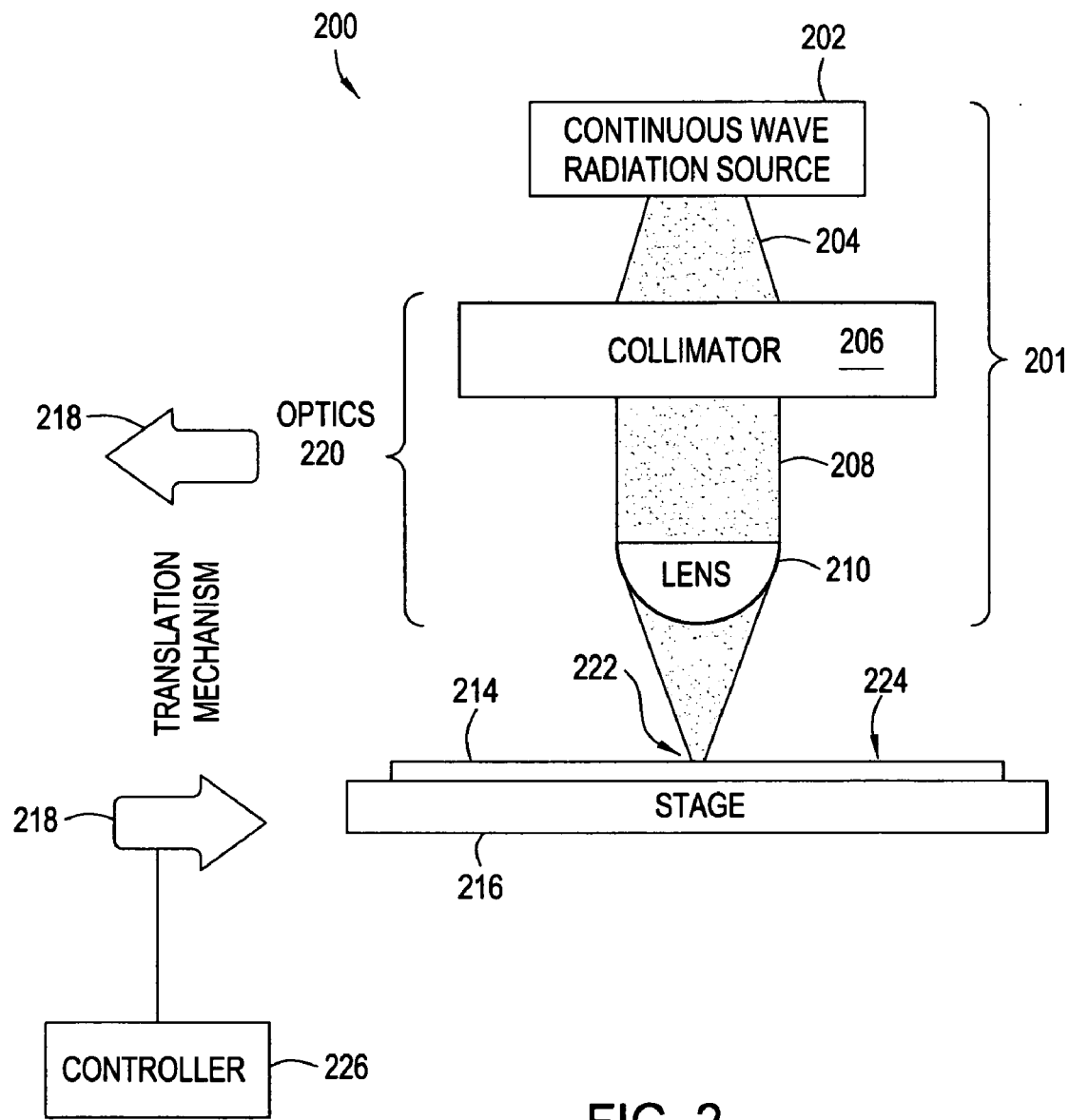
FIG. 2 is a diagram of a side view of a laser annealing apparatus for use according to embodiments described herein.

An example of a laser apparatus 200 that may be used with embodiments described herein is shown in FIG. 2. The apparatus 200 comprises a continuous wave electromagnetic radiation module 201, a stage 216 configured to receive a substrate 214 thereon, and a translation mechanism 218. The continuous wave electromagnetic radiation module 201 comprises a continuous wave electromagnetic radiation source 202 and focusing optics 220 disposed between the continuous wave electromagnetic radiation source 202 and the stage 216.

In a preferred embodiment, the continuous wave electromagnetic radiation source 202 is capable of emitting radiation continuously for at least 15 seconds. Also, in a preferred embodiment, the continuous wave electromagnetic radiation source 202 comprises multiple laser diodes, each of which produces uniform and spatially coherent light at the same wavelength. In yet another preferred embodiment, the power of the laser diode/s is in the range of 0.5 kW to 50 kW, but preferably approximately 2 kW. Suitable laser diodes are made by Coherent Inc. of Santa Clara, Calif.; Spectra-Physics of California; or by Cutting Edge Optronics, Inc. of St. Charles Mo. A preferred laser diode is made by Cutting Edge Optronics, although another suitable laser diode is Spectra Physics' MONSOON® multi-bar module (MBM), which provides 40–480 watts of continuous wave power per laser diode module.

The focusing optics 220 preferably comprise one or more collimators 206 to collimate radiation 204 from the continuous wave electromagnetic radiation source 202 into a substantially parallel beam 208. This collimated radiation 208 is then focused by at least one lens 210 into a line of radiation 222 at an upper surface 224 of the substrate 214.

Lens 210 is any suitable lens, or series of lenses, capable of focusing radiation into a line. In a preferred embodiment, lens 210 is a cylindrical lens. Alternatively, lens 210 may be one or more concave lenses, convex lenses, plane mirrors, concave mirrors, convex mirrors, refractive lenses, diffractive lenses, Fresnel lenses, gradient index lenses, or the like.

The stage 216 is any platform or chuck capable of securely holding the substrate 214 during translation, as explained below. In a preferred embodiment, the stage 216 includes a means for grasping the substrate, such as a frictional, gravitational, mechanical, or electrical system. Examples of suitable means for grasping include, mechanical clamps, electrostatic or vacuum chucks, or the like.

The apparatus 200 also comprises a translation mechanism 218 configured to translate the stage 216 and the line of radiation 222 relative to one another. In one embodiment, the translation mechanism 218 is coupled to the stage 216 to move the stage 216 relative to the continuous wave electromagnetic radiation source 202 and/or the focusing optics 220. In another embodiment, the translation mechanism 218 is coupled to the continuous wave electromagnetic radiation source 202 and/or the focusing optics 220 to move the continuous wave electromagnetic radiation source 202 and/or the focusing optics 220 relative to the stage 216. In yet another embodiment, the translation mechanism 218 moves both the continuous wave electromagnetic radiation source 202 and/or the focusing optics 220, and the stage 216. Any suitable translation mechanism may be used, such as a conveyor system, rack and pinion system, or the like.

The translation mechanism 218 is preferably coupled to a controller 226 to control the scan speed at which the stage 216 and the line of radiation 222 move relative to one another. In addition, translation of the stage 216 and the line of radiation 222 relative to one another is preferably along a path perpendicular to the line of radiation 222 and parallel to the upper surface 224 of the substrate 214. In a preferred embodiment, the translation mechanism 218 moves at a constant speed. Preferably, this constant speed is approximately 2 cm/s for a 35 micron wide line. In another embodiment, the translation of the stage 216 and the line of radiation 222 relative to one another is not along a path perpendicular to the line of radiation 222.

The laser shown and described with respect to FIG. 2 and other embodiments of lasers that may be used with the embodiments described herein are further described in commonly assigned U.S. patent application Ser. No. 10/126,419, filed Apr. 18, 2002, entitled "Thermal Flux Process by Scanning," which is incorporated by reference herein.

After the substrate is annealed, the layer may be removed from the substrate. In embodiments in which the layer comprises amorphous carbon or amorphous carbon and a dopant selected from a group consisting of nitrogen, boron, phosphorus, fluorine, or combinations thereof, the layer may be removed from the substrate by an oxygen ashing process.

Figure 3A:
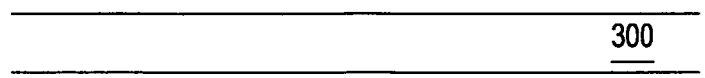
FIGS. 3A–3F are cross sectional views showing an embodiment of a substrate processing sequence.
Figure 3B:
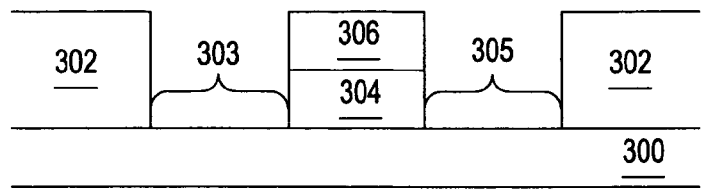
Figure 3C:
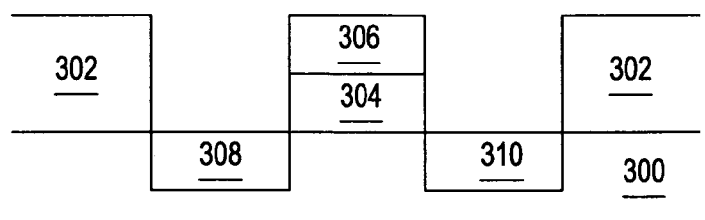
Figure 3D:
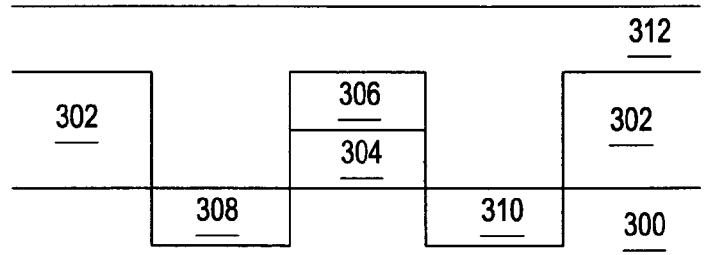
Figure 3E:
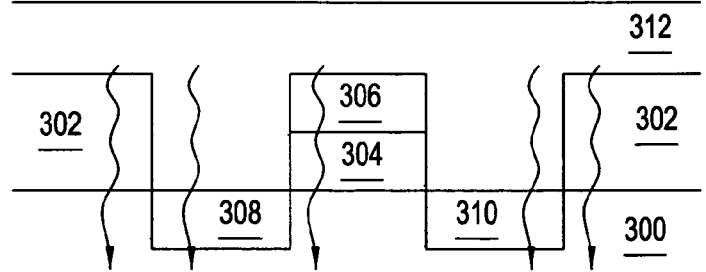
Figure 3F:
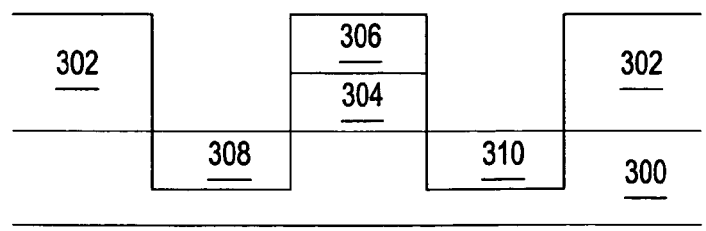

An exemplary substrate processing sequence according to an embodiment of the invention is described below with respect to FIGS. 3A–3F. A substrate 300 comprising silicon is provided, as shown FIG. 3A. A field oxide layer 302, a gate dielectric 304, and a gate electrode 306 are deposited and patterned on the substrate 300 according to conventional methods to form gate source area 303 and drain source area 305 in the substrate 300, as shown in FIG. 3B. Dopant ions are then implanted into the substrate 300 to form gate source 308 and gate drain 310, as shown in FIG. 3C. A layer 312 comprising amorphous carbon and optionally a dopant is then deposited according to an embodiment of the invention on the substrate 300, as shown in FIG. 3D. The substrate 300 is then laser annealed according to an embodiment of the invention, as shown in FIG. 3E. The layer 312 is then removed from the substrate, as shown in FIG. 3F, such as by an oxygen ashing process.

While FIGS. 3A–3F show only one gate device on a substrate, it is recognized that the layers described herein will typically be formed on a substrate that includes a plurality of devices of different sizes, types, and materials and spaced at varying densities across the surface of the substrate. It is believed that the layers promote uniform heating across a surface of the substrate during laser annealing of the substrate in spite of varying device topography across the surface of a substrate. In particular, it is believed that the layers have high emissivities for electromagnetic radiation having a wavelength of between about 808 nm and about 810 nm that promote uniform heating across a surface of the substrate during a laser annealing process in which the substrate is exposed to electromagnetic radiation having a wavelength of between about 808 nm and about 810 nm.

EXAMPLES

Examples 1–9

A layer comprising amorphous carbon was deposited on 9 silicon substrates in a PECVD chamber under the following processing conditions: 550° C., 7 Torr, 700 watts RF power at a frequency of 13.56 MHz, 1200 sccm $C_3H_6$, 650 sccm He, and a spacing of 270 mils between the chamber showerhead and the substrate support. The layer was deposited in the absence of a chamber shadow ring in Examples 1–7. The layer was deposited with a chamber shadow ring present in Examples 8 and 9. The substrate was then laser annealed according to embodiments provided herein. The thickness of the deposited layer, deposition time, and the emissivity of the layer to electromagnetic radiation of 810 nm are shown in Table 1.

TABLE 1

| Substrate | Approximate Thickness (Å) | Emissivity | Deposition Time (Sec) |
|---|---|---|---|
| 1 | 936 | 0.89 | 63 |
| 2 | 800 | 0.84 | 54 |
| 3 | 900 | 0.89 | 61 |
| 4 | 1000 | 0.91 | 68 |
| 5 | 1100 | 0.93 | 74 |
| 6 | 1200 | 0.94 | 81 |
| 7 | 1300 | 0.92 | 88 |
| 8 | 900 | 0.87 | 34 |
| 9 | 1200 | 0.9 | 45 |

Examples 10–17

A layer comprising amorphous carbon and nitrogen was deposited on 8 silicon substrates in a PECVD chamber under the following processing conditions: 400° C., 7 Torr, 1200 watts RF power at a frequency of 13.56 MHz, 350 sccm $C_3H_6$, 3400 sccm $N_2$, and a spacing of 270 mils between the chamber showerhead and the substrate support. The layer was deposited was deposited in the absence of a chamber shadow ring in Examples 10–15. The layer was deposited with a chamber shadow ring present in Examples 16 and 17. The substrate was then laser annealed according to embodiments provided herein. The thickness of the deposited layer, deposition time, and the emissivity of the layer to electromagnetic radiation of 810 nm are shown in Table 2.

TABLE 2

| Substrate | Approximate Thickness (Å) | Emissivity | Deposition Time (Sec) |
|---|---|---|---|
| 10 | 800 | 0.91 | 17 |
| 11 | 900 | 0.95 | 19 |
| 12 | 1000 | 0.98 | 21 |
| 13 | 1100 | 0.99 | 24 |
| 14 | 1200 | 0.99 | 26 |
| 15 | 1300 | 0.97 | 28 |
| 16 | 850 | 0.94 | 17 |
| 17 | 1200 | 0.98 | 25 |

As shown in Tables 1 and 2, the layers comprising amorphous carbon and amorphous carbon and nitrogen and having a thickness between about 800 Å and about 1500 Å had emissivities of 0.84 or greater for electromagnetic radiation having a wavelength of between about 600 nm and about 1000 nm, such as between about 808 nm and about 810 nm, e.g., 810 nm. It was unexpectedly found that the layers comprising amorphous carbon and nitrogen had higher emissivities than layers of a comparable thickness that included amorphous carbon but not nitrogen. It is believed nitrogen increases the thermal conductivity of an amorphous carbon layer, as the band gap for an amorphous carbon layer deposited by PECVD is typically about 1.4 eV, while the band gap of an amorphous carbon layer comprising nitrogen is typically about –0.6 eV.

Figure 4:
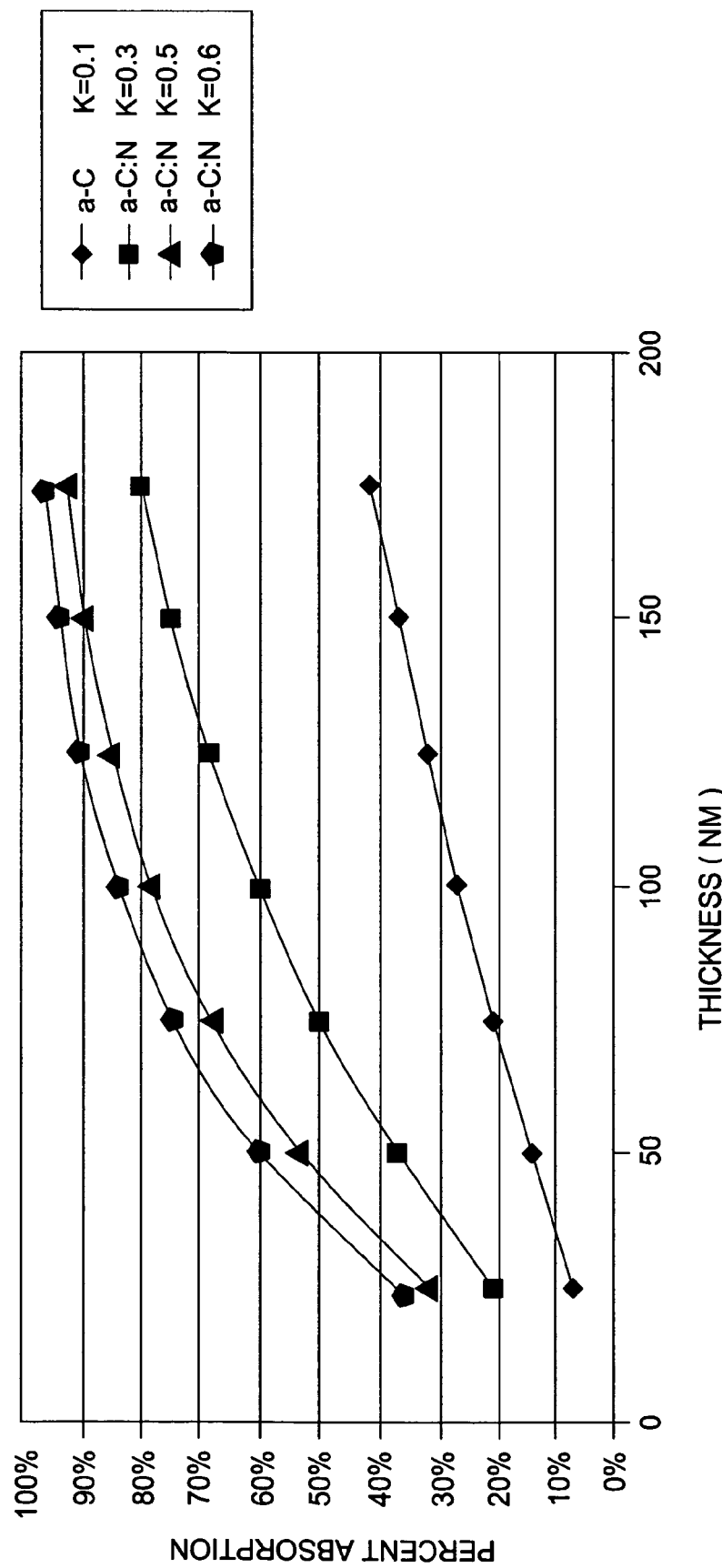
FIG. 4 is a graph showing % absorption of radiation by layers deposited according to embodiments described herein.

FIG. 4 shows the % absorption of radiation having a wavelength of 810 nm of layers with different light absorption coefficients, k, and comprising amorphous carbon or amorphous carbon and nitrogen. FIG. 4 shows that the layers comprising amorphous carbon and nitrogen absorbed a larger amount of the electromagnetic radiation having a wavelength of 810 nm than the layers of a comparable thickness that comprised carbon but not nitrogen. It is believed that adding nitrogen to an amorphous carbon layer increases the absorption of the layer of electromagnetic radiation having a wavelength of between about 808 nm and about 810 nm.

Other advantages of layers comprising amorphous carbon and nitrogen are recognized. For example, a layer comprising amorphous carbon and nitrogen can be deposited to a thickness, such as about 1150 Å, at a lower temperature, such as at about 400° C., to achieve good absorption of electromagnetic radiation having a wavelength of between about 700 nm and about 1 mm, while a layer comprising amorphous carbon but not nitrogen typically must be deposited to a thickness, such as about 1200 Å, at a higher temperature, such as at about 550° C., to achieve good absorption of electromagnetic radiation having a wavelength of between about 808 nm and about 810 nm. A lower deposition temperature is preferred, as it minimizes the substrate's exposure to temperatures that can cause undesirable re-crystallization of the silicon in the substrate.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   depositing a layer comprising amorphous carbon on the substrate; and then
   laser annealing the substrate, wherein the laser annealing comprises scanning the substrate with a line of continuous wave electromagnetic radiation; and further comprising removing the layer from the substrate after the laser annealing.

2. The method of claim 1, wherein the layer comprising amorphous carbon is deposited by plasma enhanced chemical vapor deposition.

3. The method of claim 2, wherein the layer comprising amorphous carbon is deposited from a mixture comprising $C_3H_6$.

4. A method of processing a substrate comprising:
implanting dopant ions into the substrate; and then
depositing a layer comprising amorphous carbon on the substrate; and then
laser annealing the substrate, wherein the laser annealing comprises scanning the substrate with a line of continuous wave electromagnetic radiation.

5. The method of claim 4, further comprising forming a gate source area and a gate drain area in the substrate before the implanting.

6. The method of claim 5, wherein the substrate is laser annealed for a period of time sufficient to activate the implanted dopant ions.

7. A method of processing a substrate, comprising:
depositing a layer comprising amorphous carbon and nitrogen and a dopant selected from the group consisting of boron, phosphorus, fluorine, and combinations thereof on the substrate; and then
laser annealing the substrate with a laser, wherein the layer absorbs electromagnetic radiation emitted by the laser and transfers thermal energy created by the absorbed electromagnetic radiation to the substrate.

8. A method of processing a substrate, comprising:
depositing a layer comprising amorphous carbon and nitrogen on the substrate; and then
laser annealing the substrate with a laser, wherein the layer absorbs electromagnetic radiation emitted by the laser and transfers thermal energy created by the absorbed electromagnetic radiation to the substrate and wherein the laser annealing comprises scanning the substrate with a line of continuous wave electromagnetic radiation.

9. A method of processing a substrate, comprising:
implanting dopant ions into the substrate;
depositing a layer comprising amorphous carbon and nitrogen on the substrate; and then
laser annealing the substrate with a laser, wherein the layer absorbs electromagnetic radiation emitted by the laser and transfers thermal energy created by the absorbed electromagnetic radiation to the substrate.

10. The method of claim 9, further comprising forming a gate source area and a gate drain area in the substrate before the implanting.

11. The method of claim 10, wherein the substrate is laser annealed for a period of time sufficient to activate the implanted dopant ions.

12. A method of processing a substrate comprising silicon, the method comprising:
depositing a layer having a thickness of between about 200 Å and about 2.5 µm under conditions sufficient to provide the layer with an emissivity of about 0.84 to about 0.99 for electromagnetic radiation having a wavelength of between about 600 nm and about 1000 nm; and then
laser annealing the substrate.

13. The method of claim 12, wherein the layer comprises amorphous carbon.

14. The method of claim 13, wherein the layer further comprises a dopant selected from the group consisting of nitrogen, boron, phosphorus, fluorine, and combinations thereof.

15. The method of claim 13, wherein the layer further comprises nitrogen.

16. The method of claim 12, wherein the layer has a thickness of between about 800 Å and about 1500 Å, and the layer is deposited under conditions sufficient to provide the layer with an emissivity of about 0.84 to about 0.99 for electromagnetic radiation having a wavelength of between about 808 nm and about 810 nm.

17. The method of claim 12, wherein the laser annealing comprises scanning the substrate with a line of continuous wave electromagnetic radiation.

18. The method of claim 12, further comprising implanting dopant ions into the substrate before the depositing a layer comprising amorphous carbon.

19. The method of claim 18, further comprising forming a gate source area and a gate drain area in the substrate before the implanting.

20. The method of claim 19, wherein the substrate is laser annealed for a period of time sufficient to activate the implanted dopant ions.

21. A substrate processed by a method comprising:
depositing a layer comprising amorphous carbon and nitrogen on the substrate; and then
laser annealing the substrate, wherein the laser annealing comprises scanning the substrate with a line of continuous wave electromagnetic radiation.

22. The substrate of claim 21, wherein the layer has an emissivity of about 0.84 to about 0.99 for electromagnetic radiation having a wavelength of between about 808 nm and about 810 nm.

23. A method of processing a substrate, comprising:
depositing a layer comprising amorphous carbon and a dopant selected from the group consisting of nitrogen, boron, phosphorus, fluorine, and combinations thereof on the substrate; and then
laser annealing the substrate, wherein the laser annealing comprises scanning the substrate with a line of continuous wave electromagnetic radiation.

* * * * *